United States Patent [19]
Kawanabe

[11] Patent Number: 6,070,307
[45] Date of Patent: Jun. 6, 2000

[54] EDGE COVER

[75] Inventor: Yuuichi Kawanabe, Saitama, Japan

[73] Assignee: Fuji Photo Optical Co., Ltd., Saitama, Japan

[21] Appl. No.: 09/281,434

[22] Filed: Mar. 30, 1999

[30] Foreign Application Priority Data

Jun. 10, 1998 [JP] Japan ................................. 10-162100

[51] Int. Cl.$^7$ ............................. A44B 21/00; H02G 3/14
[52] U.S. Cl. ............................. 24/457; 24/455; 24/458; 174/53; 174/66
[58] Field of Search .............................. 24/458, 457, 455

[56] References Cited

U.S. PATENT DOCUMENTS

| | | | |
|---|---|---|---|
| 3,584,136 | 6/1971 | Robert | 174/53 |
| 4,036,396 | 7/1977 | Kennedy et al. | 174/67 |
| 4,356,599 | 11/1982 | Larson et al. | 24/457 |
| 4,984,982 | 1/1991 | Brownlie et al. | 174/53 |
| 5,955,702 | 9/1999 | Grossman et al. | 174/66 |

Primary Examiner—Victor N. Sakran
Attorney, Agent, or Firm—Leydig, Voit & Mayer

[57] ABSTRACT

Provided is an edge cover capable of covering the edge of an opening and clamping a wire passing through the opening by comprising a clamping portion connected to a covering portion to clamp the wires drawn from the opening. The edge cover has covering portion for covering edge of opening. The edge cover has clamping portion that is connected to covering portion in such a way that clamping portion can be bent with respect to covering portion to cover opening and clamp wire that passes through opening. As consequence, wire can be protected from edge of opening 11 and meanwhile disposed securely along wall.

12 Claims, 10 Drawing Sheets

EDGE COVER

BACKGROUND OF THE INVENTION

1. Field of the Invention

The present invention relates to an edge cover for covering the edge of an opening, and more particularly relates to an edge cover also functioning as a clamping member for clamping wires passing through the opening.

2. Related Background Art

When wires for electric wiring pass through an opening of a metal enclosure in an electric apparatus or the like, the problems such as the peeling of the coatings of the wires that touch the edge of the opening should be prevented. Consequently, an edge cover for covering the edge of the opening is usually attached to the edge of the opening. Further, in order to dispose the wires, which are drawn from the opening, along the inner wall of the enclosure, a clamp is used, in addition to the edge cover, to clamp thus fixing the wires to the inner wall of the enclosure.

SUMMARY OF THE INVENTION

However, as shown in FIG. 13, when wire C is drawn from opening B to which edge cover A is attached, wire C forms a projection at opening B even if wire C is fixed to wall E by clamp D. In this case, when space F for housing wire C is not so wide, projection H of wire C at opening B will obstruct the arrangement of other parts.

Therefore, in order to solve the above-mentioned problem, an object of the present invention is to provide an edge cover for covering the edge of an opening while clamping the wire s passing through the opening.

In order to attain this object, the edge cover according to the present invention comprises a covering portion for covering an edge of an opening formed in a wall; and a clamping portion connected with the covering portion in such a way that the clamping portion can be bent with respect to the covering portion to a position in which the clamping portion covers the opening and clamps along the wall a wire passing through the opening.

The edge cover according to the present invention further comprises a hook means for hooking the clamping portion in the position to which the clamping portion is bent to cover the opening.

According to the present invention, the wire can be protected from the edge of the opening by the covering portion, and can be clamped securely and readily by simply bending the clamping portion with respect to the covering portion so as to dispose the wire along the wall.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Figure 1:
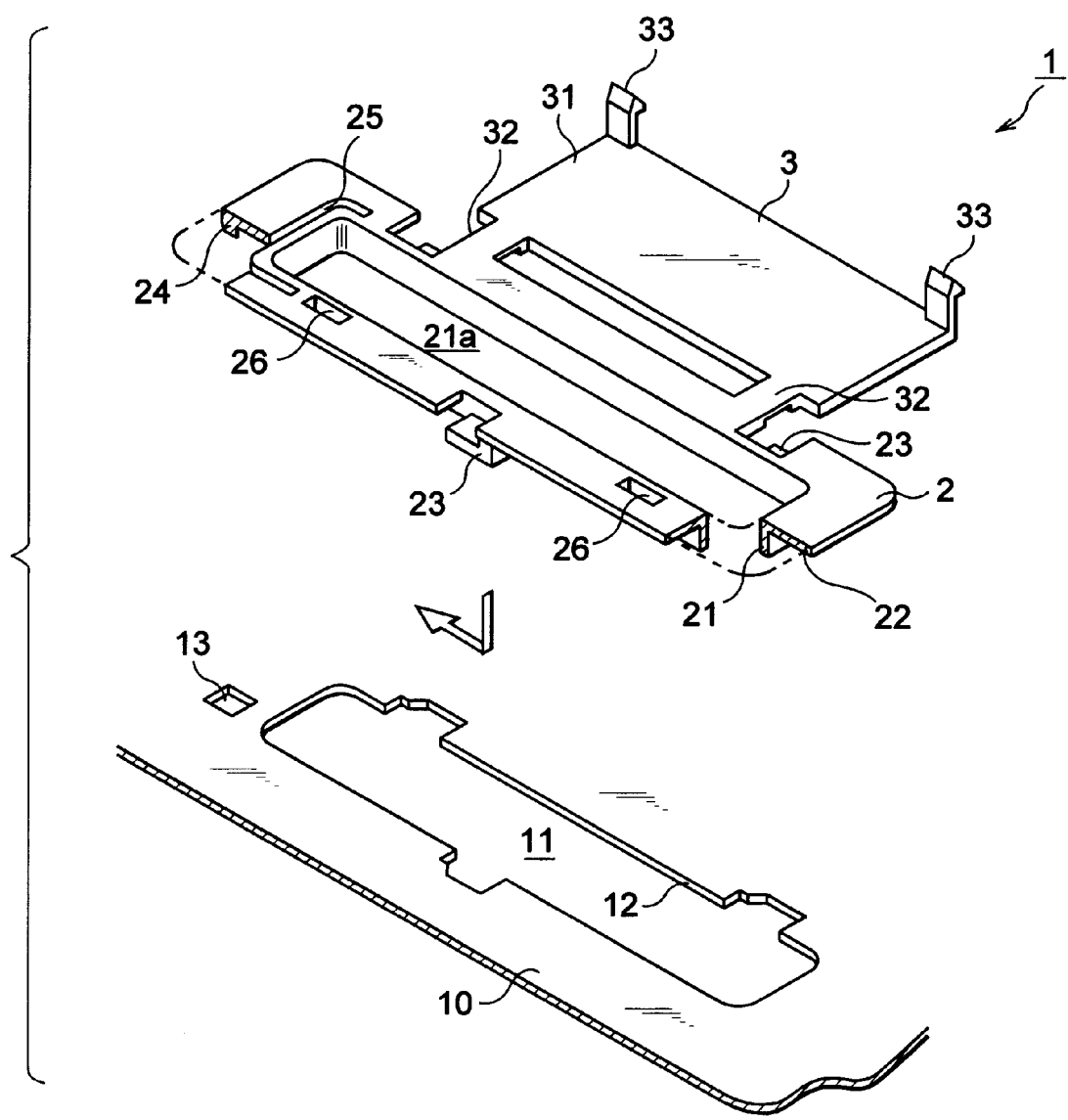
FIG. 1 is an explanatory drawing of an edge cover.

Various embodiments of the present invention will be described hereinafter with reference to drawings. The identical elements in the drawings are denoted with the identical reference numerals. Dimension ratios of the drawings are set for explanation but not always in conformity with each other.

First Embodiment

FIG. 1 shows an edge cover according to the present embodiment. As shown in FIG. 1, edge cover 1, which is mounted to opening 11 formed in wall 10, comprises a covering portion 2 for covering edge 12 of opening 11. Covering portion 2 has an insertion portion 21. When edge cover 1 is mounted to opening 11, insertion portion 21 is inserted into the opening 11 and covers the surface of edge 12. Insertion portion 21 is formed into a ring corresponding to the shape of the opening 11, and the inner space of insertion portion 21 forms a through hole 21a for wire 4.

Flange 22 is formed on the outside of insertion portion 21. Flange 22 projects from the outside of the insertion portion 21 and is located on the surface of wall 10 when edge cover 1 is mounted to opening 11.

Brackets 23 are formed on the rear side of flange 22. Brackets 23 for engaging edge cover 1 to wall 10 when edge cover 1 is mounted to opening 11 are formed to project from the rear side of flange 22. Each of brackets 23 is shaped, for example, to an "L" as shown in FIG. 1. Alternatively, a plurality of brackets 23 are disposed in the positions to hold insertion portion 21 therebetween.

Stopper 24 is formed on the rear side of flange 22 to prevent edge cover 1 from moving on wall 10 when edge cover 1 has been mounted to the opening 11. Stopper 24 is formed to project from the rear side flange 22 and is inserted to hole 13 in wall 10 when edge cover 1 is mounted to opening 11.

Further, flange 22 has slit 25 formed between a portion where stopper 24 is formed and insertion portion 21 so as to provide flexibility to the portion where stopper 24 is formed. Due to the formation of slit 25, the portion of flange 22 in which stopper 24 is formed can be bent readily when edge cover 1 is mounted to opening 11 so that stopper 24 can be fit smoothly into hole 13 by the slide of edge cover 1.

In edge cover 1, clamping portion 3 is connected with flange 22 of covering portion 2. Clamping portion 3 comprises a clamping body 31 for clamping wire 4 that passes through opening 11. Clamping body 31 is connected rotatably to flange 22 via a connection portion 32 so that clamping body 31 can be rotated about connection portion 32 as the axial of rotation to the position in which clamping body 31 covers through hole 21a.

In addition to the function of connecting clamping body 31 to flange 22, connection portion 32 allows, due to its bending, the rotation of clamping portion 3 to the position in which wire 4 is clamped by clamping body 31. Connection portion 32 is thinner than clamping body 31 as well as other portions, and has a structure that can be bent readily.

Further, clamping body 31 is provided with hooks 33 for hooking clamping body 31 near through hole 21a when clamping body 31 is rotated to the position to clamp wire 4, thus clamping body 31 is kept in that state. Hooks 33 project from the surface of clamping body 31 and have their tips hooked. Hooks 33 are fit into hook holes 26 in flange 22 by rotating clamping body 31 thus hooking clamping body 31.

Next, the method of using edge cover 1 will be explained.

Figure 2:
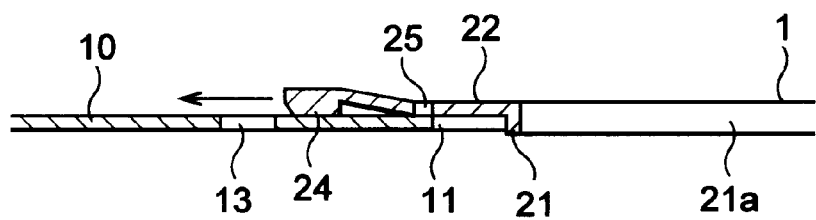
FIG. 2 is an explanatory drawing of a method of using the edge covers.

First, the mounting of edge cover 1 to opening 11 will be explained. As shown in FIG. 1, edge cover 1 is positioned near opening 11 formed in wall 10, and insertion portion 21 is fit into opening 11. Then, as shown by the arrow in FIG. 1, edge cover 1 is slid along wall 10 until brackets 23 are engaged in opening 11 and stopper 24 is fit into hole 13 in wall 10. At this time, as shown in FIG. 2, due to the slit 25 formed in flange 22 of edge cover 1, that portion of flange 22 where stopper 24 is formed can bend easily, thus edge cover 1 can be slid readily while keeping the other portions of flange 22 positioned on the surface of wall 10.

The mounting of edge cover 1 is completed when stopper 24 is fit into hole 13 by sliding edge cover 1. Edge cover 1 mounted to opening 11 is prevented from slipping out of opening 11 by brackets 23 and is prevented from moving along wall 10 by stopper 24. Consequently, it is not easy for edge cover 1 to remove from the opening 11.

Figure 3:
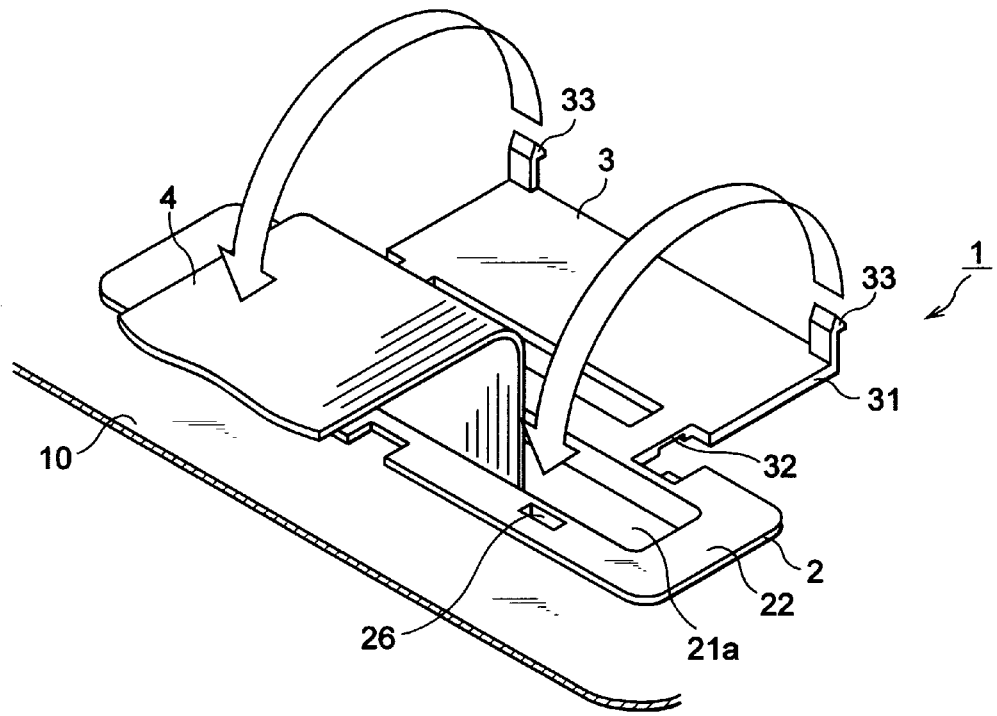
FIG. 3 is an explanatory drawing of the method of using the edge covers.
Figure 4:
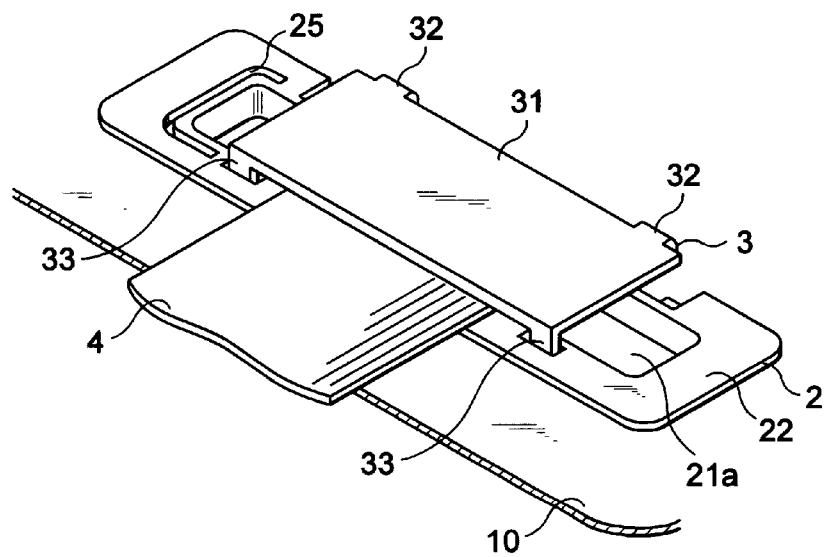
FIG. 4 is an explanatory drawing of the method of using the edge covers.

Next, the wiring of wire 4 is carried out. As shown in FIG. 3, wire 4 passes through the through hole 21a of edge cover 1. At this time, since edge 12 of opening 11 is covered by insertion portion 21, wire 4 is not damaged when it passes through opening 11. Wire 4 shown in FIG. 4 is a harness comprising a plurality of wires aligned and integrated with resin or the like, but, without being limited thereto, wire 4 may be other forms of wires, for example a single wire, provided that it has a certain extent of flexibility.

Then, as shown by the arrows in FIG. 3, clamping body 31 is rotated about connection portion 32 to a position to block through hole 21a. Then, hooks 33 are inserted and engaged in hook holes 26 whereby clamping portion 31 is fixed to flange 22. Therefore, wire 4 passing through the through hole 21a is clamped by clamping body 31 to extend along wall 10 without projecting from through hole 21a. Therefore, the space to which wire 4 is drawn can be used effectively since wire 4 does not project in this space.

As described above, according to edge cover 1 of the present embodiment, wire 4 can be surely protected from edge 12 of opening 11 by covering portion 2 and clamped securely and readily by simply bending clamping portion 3 with respect to cover portion 2 so as to dispose wire 4 along wall 10 that has opening 11 formed therein. As a consequence, the space to which wire is drawn can be used effectively. Particularly, in a copying machine for example, the edge cover is used effectively in a portion where a harness is drawn out to a scanner portion that reads images from an output portion to perform printing.

Figure 5:
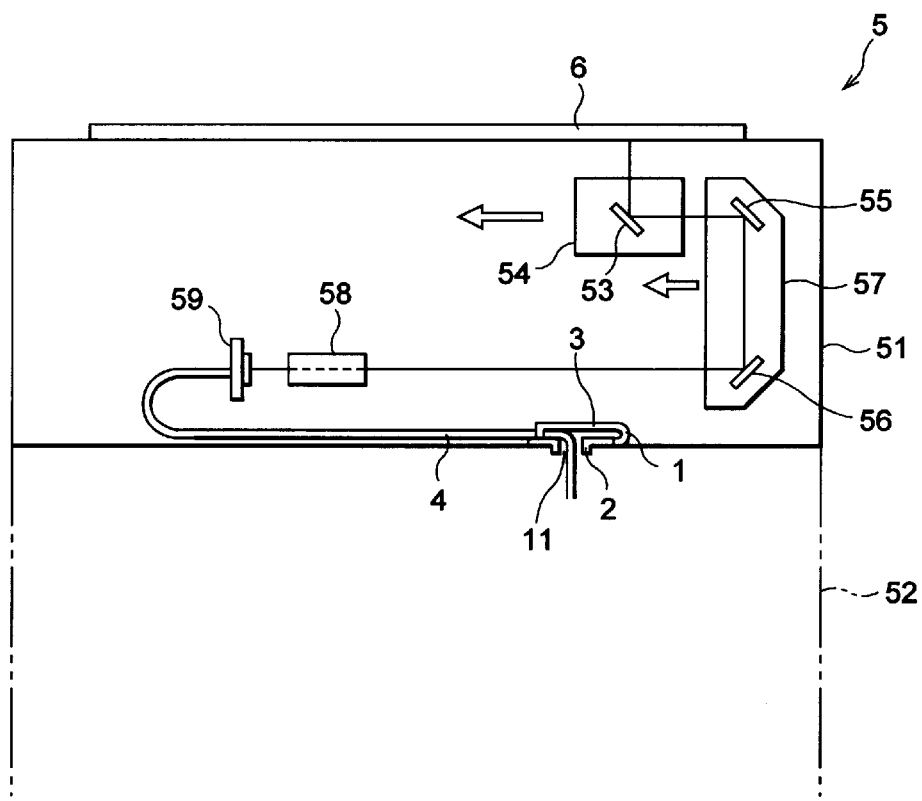
FIG. 5 is an explanatory drawing showing the case of applying the edge cover to a copying machine.

FIG. 5 shows an example of applying edge cover 1 to a copying machine. As shown in FIG. 5, in copying machine 5, scanner portion 51 is disposed above output portion 52. Scanner portion 51 reads the image of an object 6 to be copied. Scanner portion 51 contains first carriage 54 in which first mirror 53 is disposed; and second carriage 57 in which second mirror 55 and third mirror 56 are disposed. First carriage 54 and second carriage 57 are provided to be able to reciprocate in the same direction in scanner portion 51.

Scanner portion 51 further contains lens 58 for accepting the image of third mirror 56; and image sensor 59 for converting the image accepted by lens 58 into an electric signal. Wire 4 linked to image sensor 59 is drawn from output portion 52 through opening 11 in the bottom of scanner portion 51.

Edge cover 1 is mounted to opening 11. Thus, wire 4 is protected from the edge of opening 11 by edge cover 1 since wire 4 is kept from contacting the edge of the opening. Further, wire 4 is clamped in scanner portion 51 by clamping portion 3 of edge cover 1 so that wire 4 is disposed along the bottom of scanner portion 51 without projecting from opening 11 to the interior of scanner portion 51. Accordingly, the obstruction caused by wire 4 to the movement of second carriage 57 and the like is prevented, and the small size of scanner 51 can be realized since the inner space of scanner portion 51 can be used effectively due to the arrangement of wire 4 along the bottom of scanner portion 51.

Second Embodiment

An edge cover according to the second embodiment will be explained hereinafter.

Figure 6:
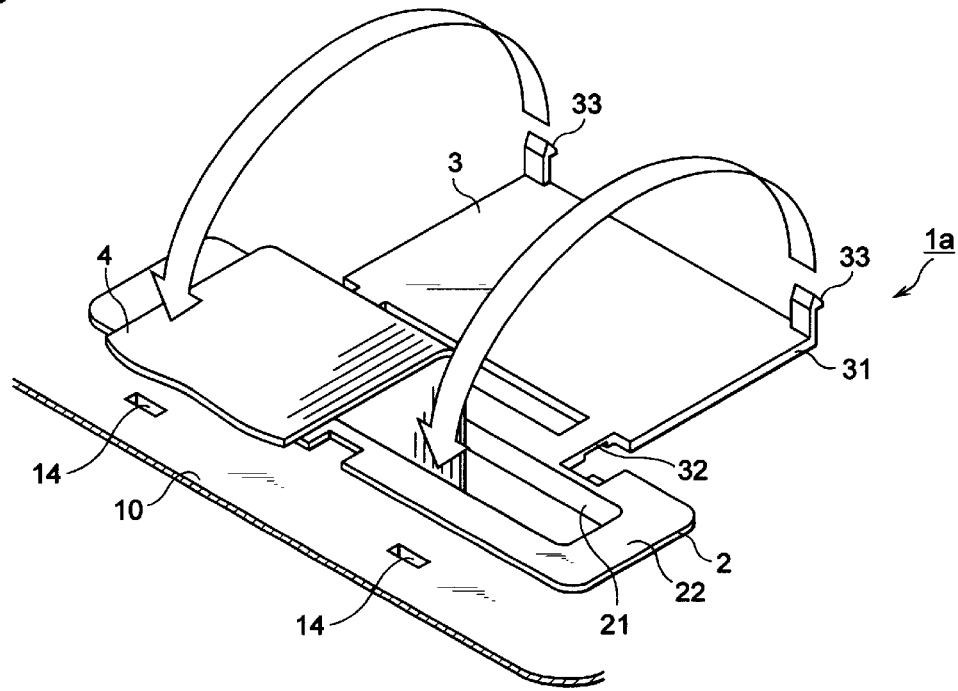
FIG. 6 is an explanatory drawing of an edge cover according to the second embodiment.
Figure 7:
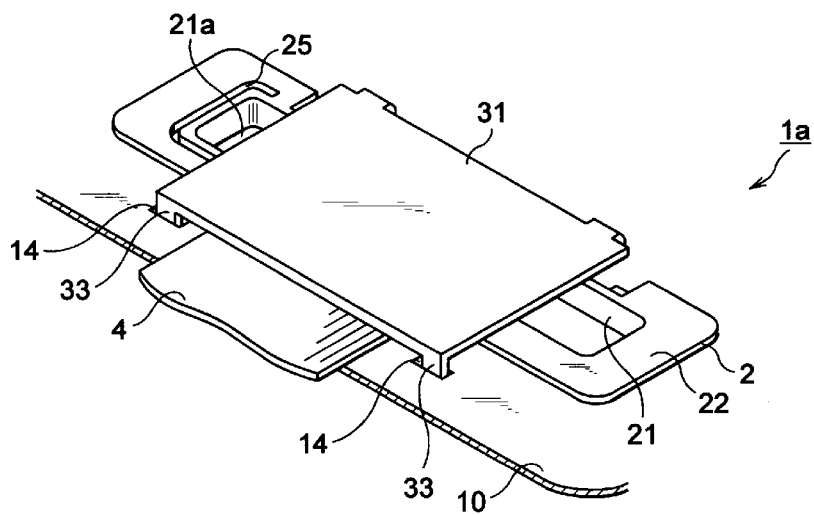
FIG. 7 is an explanatory drawing of the edge cover according to the second embodiment.

FIGS. 6 and 7 show edge cover 1a according to the present embodiment. As shown in FIG. 6, the structure of edge cover 1a is almost the same as that of edge cover 1 according to the first embodiment except that hook holes 26 into which hooks 33 are fit are omitted. Specifically, in edge cover 1a, clamping body 31 is hooked near through hole 21a by fitting hooks 33 into hook holes 14 formed in wall 10.

According to edge cover 1a of the present embodiment, in addition to the effects similar to those attained by edge cover 1 in the first embodiment, clamping body 31 can be formed larger, therefore wire 4 can be more securely clamped and disposed on wall 10.

Third Embodiment

Edge covers according to the third embodiment will be explained hereinafter.

Figure 8:
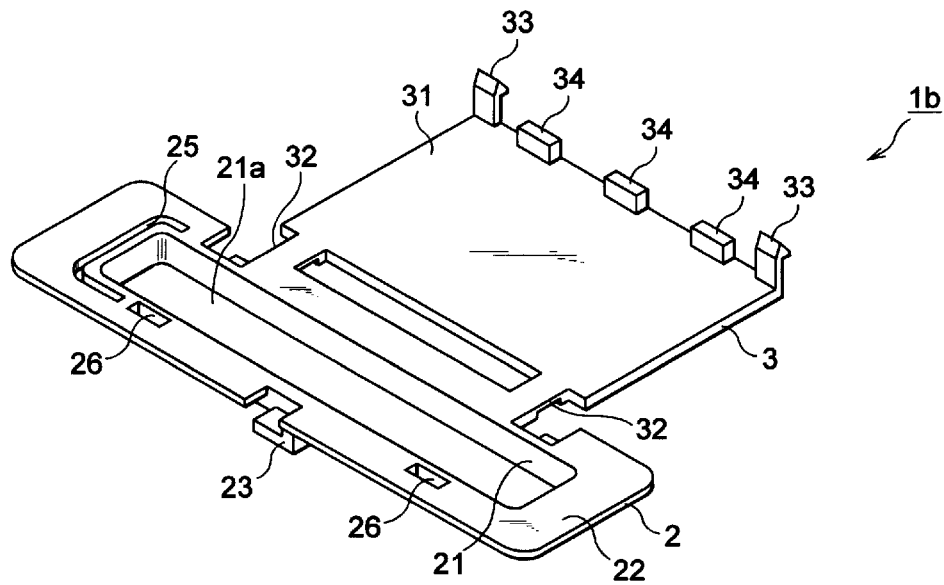
FIG. 8 is an explanatory drawing of an edge cover according to the third embodiment.
Figure 9:
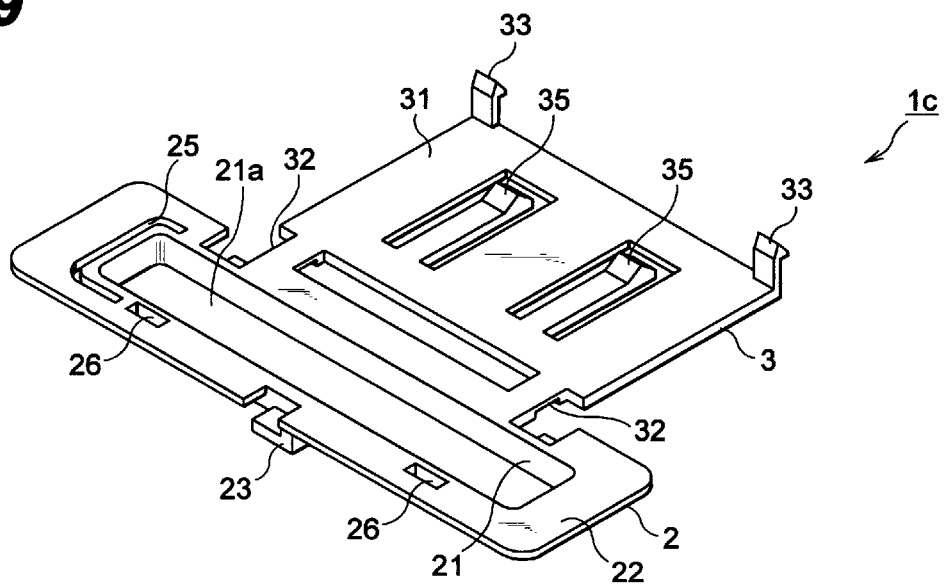
FIG. 9 is an explanatory drawing of an edge cover according to the third embodiment.

FIGS. 8 and 9 show the edge covers according to the present embodiment. As shown in FIGS. 8 and 9, the structures of edge covers 1b, 1c according to the present embodiment are almost the same as that of edge cover 1 in the first embodiment except that clamping body 31 is provided with a clamping means for clamping wire 4. Specifically, in edge cover 1b, clamping body 31 is provided with protrusions 34 formed on its surface that contacts wire 4. When wire 4 to be clamped is in the shape of a strip, a plurality of protrusions 34 are preferably aligned in the width direction. Further, in edge cover 1c as shown in FIG. 9, clamping body 31 is provided with pressing portions 35. Each of pressing portions 35 is formed in a U-shaped hole punched in clamping body 31 and has a protrusion on the face that contacts wire 4. When clamping body 31 clamps wire 4, pressing portions 35 press wire 4 resiliently against wall 10 like a spring.

In addition to the effects similar to those attained by edge cover 1 in the first embodiment, the above-described edge covers 1b, 1c can clamp thus disposing wire 4 more securely on wall 10 due to the function of protrusions 34 or pressing portions 35.

Fourth Embodiment

An edge cover according to the fourth embodiment will be explained hereinafter.

Figure 10:
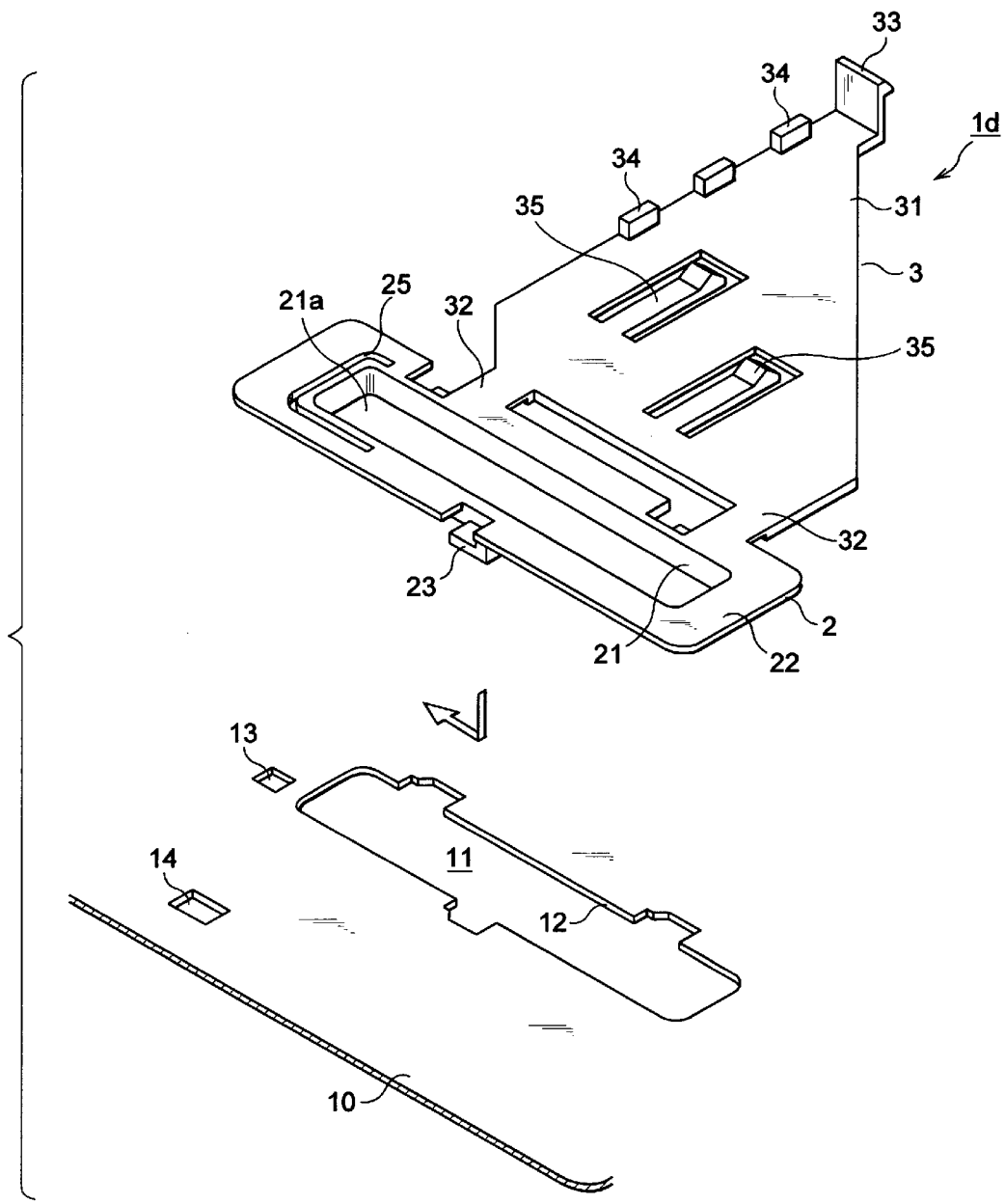
FIG. 10 is an explanatory drawing of an edge cover according to the fourth embodiment.

FIG. 10 shows the edge cover according to the present embodiment. As shown in FIG. 10, the structure of edge cover 1d according to the present embodiment is basically the same as that of edge cover 1 according to the first embodiment excepted that in edge cover 1d, clamping body 31 is shaped to a substantial triangle and comprises both protrusion 34 and pressing portion 35.

Figure 11:
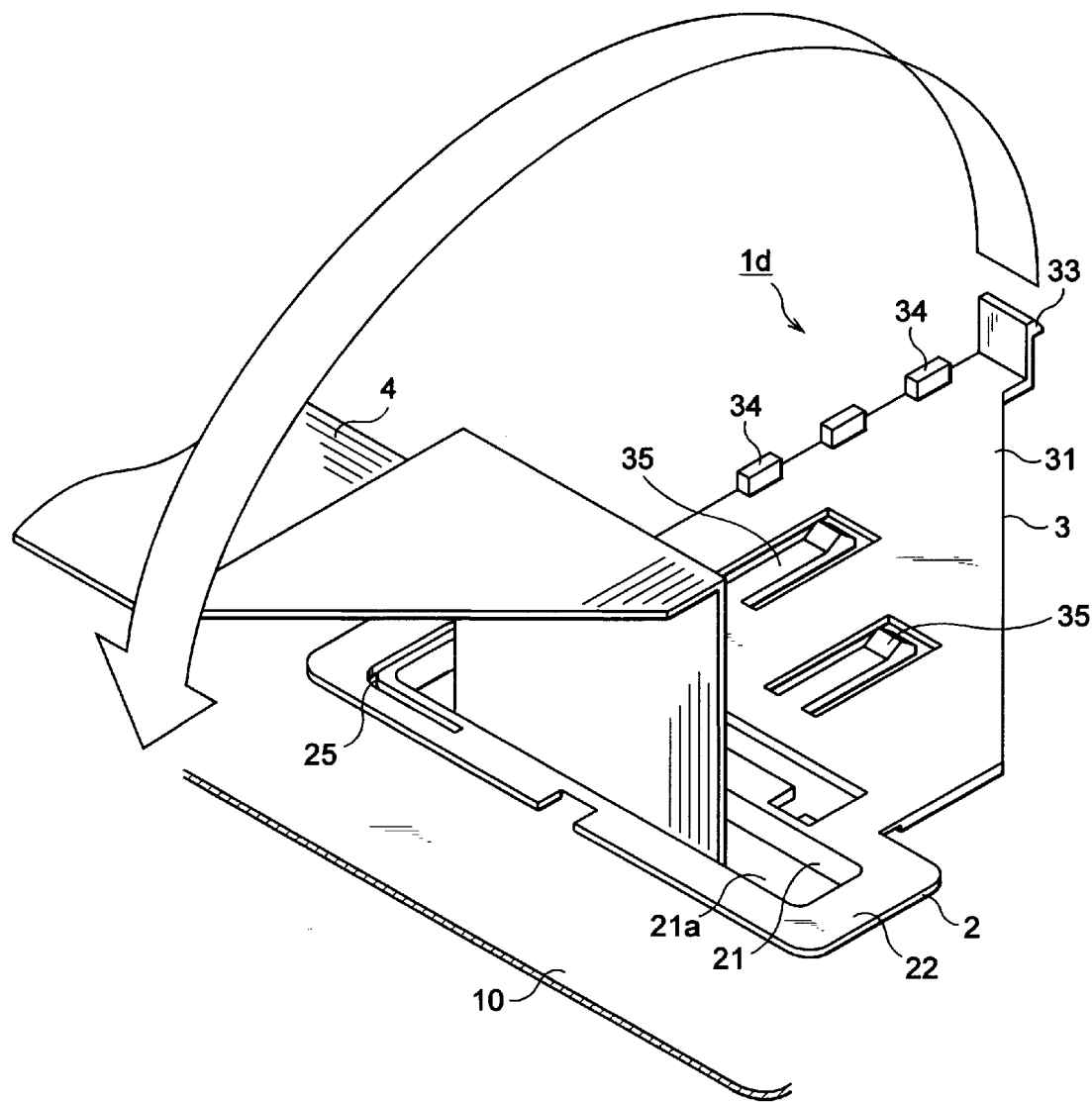
FIG. 11 an explanatory drawing of the edge cover according to the fourth embodiment.
Figure 12:
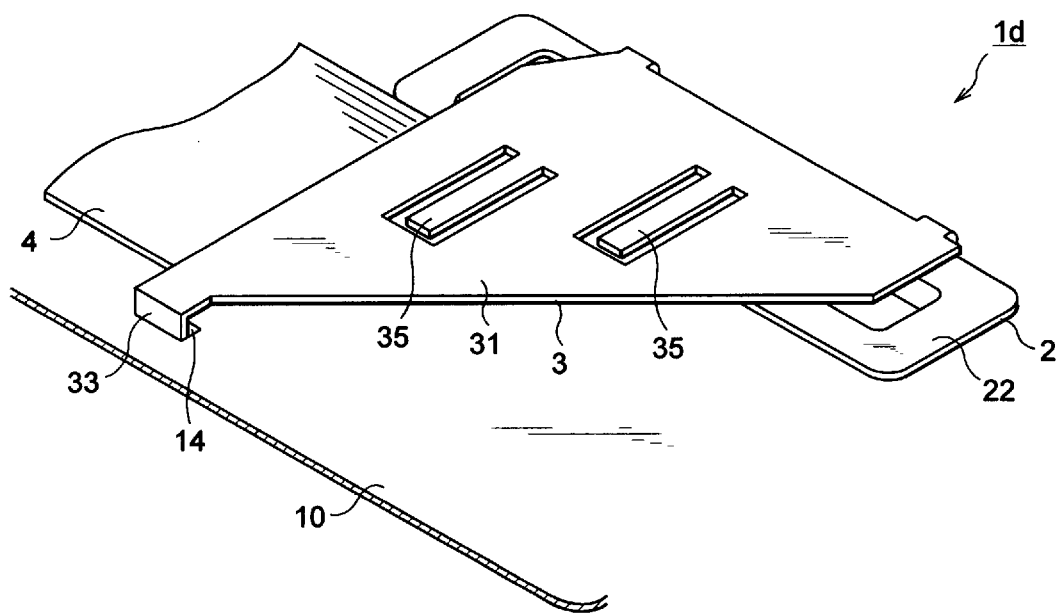
FIG. 12 an explanatory drawing of the edge cover according to the fourth embodiment.
Figure 13:
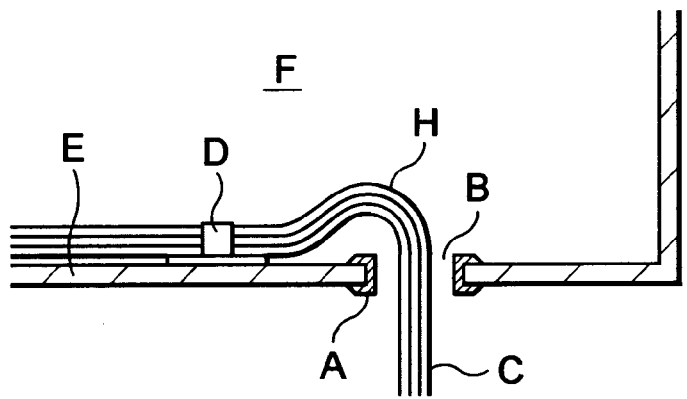
FIG. 13 an explanatory drawing of prior art.

According to edge cover 1d as shown in FIG. 11, after strip wire 4 is drawn from through hole 21a of edge cover 1d and this drawn portion of wire 4 is folded on the bias, clamping body 31 is rotated to clamp wire 4 against wall 10 as shown in FIG. 12. Further, in this embodiment, wire 4 can be arranged in a direction identical to the longitudinal direction of opening 11.

Further, pressing portions 35 formed on clamping body 31 press resiliently the folded portion of wire 4, and protrusions 34 formed on clamping body 31 clamp securely the edged of the folded portion of wire 4. Consequently, even if wire 4 is folded, it can be clamped securely on wall 10.

As described above, in addition to the effects similar to those attained by edge cover 1 in the first embodiment, edge covers 1d can dispose wire 4 drawn from opening 11 in the longitudinal direction of opening 11 and clamp wire 4 securely on wall 10.

As described above, according to the present invention, the wire can be protected from the edge of the opening by the covering portion and can be surely and readily clamped by simply bending the clamping portion with respect the covering portion.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A unitary resilient edge cover comprising:
   a covering portion for covering an edge of an opening in a wall, the covering portion including a hook hole;
   a connection portion connected to and extending from said covering portion;
   a clamping portion including a clamping body connected to and extending from said connection portion and including a hook projecting transversely to said clamping body for engaging the hook hole in said covering portion when said edge cover is folded at said connection portion so that said clamping body is positioned opposite and spaced from said covering portion, covering the opening in the wall, and said hook, by engaging the hook hole, retains said clamping body opposite and spaced from said covering portion for passage of a wire through the opening in the wall and between said covering portion and said clamping body along the wall, said covering portion covering the edge of the opening and protecting the wire from the edge of the opening.

2. The edge cover according to claim 1 including two hooks extending transversely from said clamping body and two hook holes in said covering portion for engaging said hooks and retaining said clamping body opposite said covering portion when said hooks engage the hook holes.

3. The edge cover according to claim 1 wherein said covering portion includes a flange including the hook hole and an insertion portion transverse to the flange and defining an opening in said covering portion for passage of the wire, said flange and said insertion portion together covering the edge of the opening in the wall.

4. The edge cover according to claim 1 including at least one protrusion extending transverse to said clamping body for maintaining a separation between said clamping body and said covering portion when said hook engages the hook hole.

5. The edge cover according to claim 1 wherein said clamping body includes at least one resilient pressing portion defined by a U-shaped hole through said clamping body and having a protrusion transverse to said clamping body for exerting pressure on the wire passing through the opening in the wall and between said clamping body and said covering portion.

6. The edge cover according to claim 1 wherein said covering portion includes a bracket for slidingly engaging a complementary slot in the wall for securing said edge cover to the wall.

7. A unitary resilient edge cover comprising:
   a covering portion for covering an edge of an opening in a wall;
   a connection portion connected to and extending from said covering portion;
   a clamping portion including a clamping body connected to and extending from said connection portion and including a hook projecting transversely to said clamping body for engaging a corresponding hook hole in the wall when said edge cover is folded at said connection portion so that said clamping body is positioned opposite and spaced from said covering portion, covering the opening in the wall, and said hook, by engaging the hook hole, retains said clamping body opposite and spaced from said covering portion for passage of a wire through the opening in said covering portion, and between said covering portion and said clamping body along the wall, said covering portion covering the edge of the opening and protecting the wire from the edge of the opening.

8. The edge cover according to claim 7 including two hooks extending transversely from said clamping body for engaging corresponding hook holes in the wall for retaining said clamping body opposite said covering portion when said hooks engage the hook holes.

9. The edge cover according to claim 7 wherein said covering portion includes a flange and an insertion portion transverse to the flange and defining an opening in said covering portion for passage of the wire, the flange and insertion portion together covering the edge of the opening in the wall.

10. The edge cover according to claim 7 including at least one protrusion extending transverse to said clamping body for maintaining a separation between said clamping body and said covering portion when said hook engages the hook hole.

11. The edge cover according to claim 7 wherein said clamping body includes at least one resilient pressing portion defined by a U-shaped hole through said clamping body and having a protrusion transverse to said clamping body for exerting pressure on the wire passing through the opening in the wall and between said clamping body and said covering portion.

12. The edge cover according to claim 7 wherein said covering portion includes a bracket for slidingly engaging a complementary slot in the wall for securing said edge cover to the wall.

* * * * *